United States Patent
Galiotis et al.

(10) Patent No.: US 11,999,623 B2
(45) Date of Patent: Jun. 4, 2024

(54) ART PROTECTION WITH THE USE OF GRAPHENE MATERIALS

(71) Applicants: Foundation of Research and Technology Institute of Chemical Engineering Sciences (FORTH-ICEHT), Patras (GR); Consorzio Interuniversitario Per Lo Sviluppo Dei Sistemi A Grande Interfase (CSGI), Florence (IT)

(72) Inventors: Costas Galiotis, Patras (GR); Piero Baglioni, Florence (IT); Giorgos Anagnostopoulos, Patras (GR); Maria Giovanna Pastore Carbone, Patras (GR); Giovanna Poggi, Florence (IT); Konstantinia Papadimitriou, Patras (GR); Giorgos Paterakis, Patras (GR); Maria Kotsidi, Patras (GR); Giorgos Gorgolis, Patras (GR)

(73) Assignees: Foundation of Research and Technology Institute of Chemical Engineering Sciences (FORTH-ICEHT), Patras (GR); Consorzio Interuniversitario Per Lo Sviluppo Dei Sistemi A Grande Interfase (CSGI), Florence (IT)

( * ) Notice: Subject to any disclaimer, the term of this patent is extended or adjusted under 35 U.S.C. 154(b) by 222 days.

(21) Appl. No.: 17/420,034

(22) PCT Filed: Dec. 18, 2019

(86) PCT No.: PCT/EP2019/085993
§ 371 (c)(1),
(2) Date: Jun. 30, 2021

(87) PCT Pub. No.: WO2020/141078
PCT Pub. Date: Jul. 9, 2020

(65) Prior Publication Data
US 2022/0081301 A1    Mar. 17, 2022

(30) Foreign Application Priority Data
Dec. 31, 2018  (GR) .............................. 20180100579

(51) Int. Cl.
*C23C 16/00* (2006.01)
*C01B 32/186* (2017.01)
(Continued)

(52) U.S. Cl.
CPC .............. *C01B 32/186* (2017.08); *C09D 7/48* (2018.01); *C23C 16/26* (2013.01); *C01P 2004/64* (2013.01); *C01P 2006/60* (2013.01)

(58) Field of Classification Search
CPC ...................................................... C23C 16/00
See application file for complete search history.

(56) References Cited

U.S. PATENT DOCUMENTS 4,761,903 A * 8/1988 Cantrell ............... A47G 1/0638
40/773
8,753,468 B2 * 6/2014 Caldwell ................. C01B 32/23
156/289

(Continued)

FOREIGN PATENT DOCUMENTS

| CN | 108516541 A | 9/2018 |
| WO | 2011087301 A2 | 7/2011 |

(Continued)

OTHER PUBLICATIONS

"Ultraclean Patterned Transfer of Single-Layer Graphene by Recyclable Pressure Sensitive Adhesive Films", Sang Jin Kim, Teajun Choi, Bora Lee, Sunwoo Lee, Kyoungjun Choi, Jong Bo Park, Je Min Yoo, Nano Lett., 15, 3236-3240 (Year: 2015).*

(Continued)

*Primary Examiner* — David P Turocy
*Assistant Examiner* — Mohammad Mayy
(74) *Attorney, Agent, or Firm* — Norton Rose Fulbright US LLP; James R. Crawford

(57) ABSTRACT

The inventive method for applying a protective graphene coating onto a surface, especially onto a two- or three dimensional artwork or colored surface, comprises the following steps: a) depositing, preferably by chemical vapor deposition (CVD), graphene onto a at least one side of a supporting substrate to produce a graphene/substrate composite including a continuous graphene membrane formed on at least one side of said substrate; b) removing the substrate, or lifting off the graphene from the substrate and (Continued)

c) depositing the graphene membrane onto the surface. A protective graphene coating prepared and deposited by this method provides protection for a surface, especially a two- or three-dimensional artwork or a colored surface, against color degradation, especially fading, yellowing and discoloration due to exposure to UV radiation, dirt, dust, moisture, chemical and/or oxidizing agents.

21 Claims, 15 Drawing Sheets

(51) Int. Cl.
  *C09D 7/48* (2018.01)
  *C23C 16/26* (2006.01)

(56) References Cited

U.S. PATENT DOCUMENTS

| | | | |
|---|---|---|---|
| 9,023,220 B2 | 5/2015 | Zurutuza Elorza et al. | |
| 2005/0202220 A1* | 9/2005 | Chen | B44C 3/005 428/204 |
| 2012/0114916 A1* | 5/2012 | Anderson | D21H 19/84 427/508 |
| 2012/0258311 A1* | 10/2012 | Hong | B82Y 30/00 428/688 |
| 2012/0282419 A1* | 11/2012 | Ahn | C01B 32/186 428/688 |

FOREIGN PATENT DOCUMENTS

| | | | |
|---|---|---|---|
| WO | WO-2016123080 A1 * | 8/2016 | C08J 7/06 |
| WO | 2018161116 A1 | 9/2018 | |

OTHER PUBLICATIONS

WO_2016123080_A1_I (Year: 2016).*
International Search Report issued in PCT/EP2019/085993 dated Jun. 24, 2020.
Van Der Snickt, et al.: "Combined use of Synchrotron Radiation Based Micro-X-ray Fluorescence, Micro-X-ray Diffraction, Micro-X-ray Absorption Near-Edge, and Micro-Fourier Transform Infrared Spectroscopies for Revealing an Alternative Degradation Pathway of the Pigment Cadmium Yellow in a Painting by Van Gogh", Anal. Chem. 84:10221-10228 (2012).
Vanmeert, et al.: "Plumbonacrite Identified by X-ray Powder Diffraction Tomography as a Missing Link during Degradation of Red Lead in a Van Gogh Painting", Angew. Chem. 127:3678-3681 (2015).
Graphene-Info, Graphene-catalog, posted Mar. 18, 2018 by Roni Peleg, graphene-info.com; GRXP2020006, pp. 1-2.
Electronic Daily Update, Newsletter, translation from Greek, portal.tee.gr/portal.page/portal/INFO-TEE/INFO_2018/03_18, (2018), GRXP2020005, pp. 1-85.
Greek Search Report issued in corresponding Patent Application No. 20180100579 dated Jan. 21, 2020.
Peleg, Roni: "EU project to develop graphene-based products for protection of artwork," Graphene-info the Graphene Experts, (2018), pp. 1-2.
TEE Technical Chamber Greece Newsletter Electronic Daily Update Issue 1478 Date: Mar. 8, 2018, pp. 1-25, with English translation.
EPO Search Report dated Apr. 5, 2023 in corresponding patent application No. 19 831 678.7-1014.

* cited by examiner

ART PROTECTION WITH THE USE OF GRAPHENE MATERIALS

CROSS REFERENCE TO RELATED APPLICATIONS

This application is a national phase under 35 U.S.C. § 371 of International Application No. PCT/EP2019/085993 filed on Dec. 18, 2019, which claims the benefit of priority from Greek Patent Application No. 20180100579 filed on Dec. 31, 2018. The entire contents of these applications are incorporated herein by reference in their entirety.

The present invention relates to a method for applying a protective graphene coating onto a surface, especially onto a two- or three-dimensional artwork or colored surface. The invention further relates to the use of such method or of a protective graphene coating which has preferably been prepared and deposited according to such method for providing protection to such surface and especially to such two- or three-dimensional artwork or colored surface against color degradation like fading, yellowing and discoloration due to exposure to UV radiation, as well as against dirt, dust, moisture, chemical and/or oxidizing agents. Finally the invention relates to the use of graphene for inclusion in a dispersion which is used as a paint or dye or other colored material to avoid discoloration of an artwork of any kind created using such dispersion.

TECHNICAL BACKGROUND

The technical field of the invention is the protection of artworks, mainly paintings but also other colored objects of any kind and form. Furthermore, the technical field includes materials like commercial acrylic paints/oil paints with incorporated protection against discoloration.

All art materials are prone to environmental degradation. In particular, the introduction of new production techniques, mainly in the 20th century, has reduced their lifespan. Fading, yellowing and discoloration are the most common decomposition effects resulting from exposure to ultraviolet and visible light, as well as oxidizing agents. These effects of aging mechanisms lead to a serious and irreversible deterioration in the readability of artworks, which is an invaluable legacy of mankind. The idea that there have been so many famous paintings for 100 years or 500 years without having altered is false. Recently, it has been revealed that the red lead pigment used by van Gogh is faded (Vanmeert, F., G. Van der Snickt, and K. Janssens, *Plumbonacrite Identified by X-ray Powder Diffraction Tomography as a Missing Link during Degradation of Red Lead in a Van Gogh Painting*. Angewandte Chemie International Edition, 2015. 54(12): p. 3607-3610).

The impurities in the paint triggered a chemical reaction with the sunlight, and scientists found a rare lead-based mineral in the paint. This reacts with carbon dioxide from the air to create white crystals. It has also been found that the particular yellow pigment—cadmium yellow—reacts with sunlight and moisture, and degrades to another beige compound. The reaction can make the paint/color even fall off the canvas. Van Gogh's "Flowers in the Blue Vase" (Geert Van der Snickt, Koen Janssens, Joris Dik, Wout De Nolf, Frederik Vanmeert, Jacub Jaroszewicz, Marine Cotte, Gerald Falkenberg, and Luuk Van der Loeff. Combined use of Synchrotron Radiation Based Micro-X-ray Fluorescence, Micro-X-ray Diffraction, Micro-X-ray Absorption Near-Edge, and Micro-Fourier Transform Infrared Spectroscopies for Revealing an Alternative Degradation Pathway of the Pigment Cadmium Yellow in a Painting by Van Gogh. *Analytical Chemistry* 2012, 84 (23), 10221-10228), in particular, has been badly affected by this process. Works by many artists are at risk.

Solvents and varnishes that have long been used to protect artworks often prove to be destructive solutions. Resin-based systems for the protection of artworks exhibited in museums and galleries affect irreversibly the underlying surface of the work, while the specially used glass display cases are not capable of protecting the works adequately from the aforementioned damaging agents.

It is accordingly an object of the present invention to provide possibilities and means to protect artwork from especially UV radiation but also from other detrimental environmental effects and damaging agents.

SUMMARY OF THE INVENTION

This object is solved by using graphene either as a protective layer on artworks or for inclusion in paints, dyes, pigments and the like, themselves. Furthermore, a protective effect was also observed for boron nitride when included in such paints, dyes, pigments and the like, either alone or in combination with graphene.

In a first aspect, the present invention provides a method for applying a protective graphene coating onto a surface, especially onto a two- or three-dimensional artwork or other colored surface, the method comprising the following steps:
a) depositing, preferably by chemical vapor deposition (CVD), graphene onto at least one side of a supporting substrate to produce a graphene/substrate composite including a continuous graphene membrane formed on at least one side of said substrate;
b) removing the substrate or lifting off the graphene membrane from the substrate; and
c) depositing the graphene membrane onto the surface.

In a second aspect, the present invention teaches the use of graphene and/or boron nitride, especially in the form of a powder or a solution, for inclusion into aqueous or organic media based dispersions for their application as paints, dyes, inks, pigments and/or varnishes used for artistic purposes in order to create indelible colors to prevent color degradation, especially due to exposure to anyone of especially UV radiation, moisture and oxidizing agents.

DETAILED DESCRIPTION OF THE INVENTION AND PREFERRED EMBODIMENTS

The present invention for the first time discloses and provides an easily applicable and also easily removable protective layer that can be applied onto artworks or other surfaces which are exposed to environmental conditions which result in a deterioration of the artwork or surface in general, especially its colors and overall appearance. The inventors found that, using a process which is described in more detail below and which forms an important part of the present invention, a graphene membrane can be formed and deposited onto such artwork or other surfaces to be protected.

Since its discovery and isolation in 2004 by Geim and Novoselov which were awarded with the 2010 Nobel Prize in Physics, graphene has been considered as a "miracle material" due to its excellent chemical stability, its ability to conduct heat and electricity, and of its excellent physical/mechanical properties. Graphene is one of the many allotropic forms of carbon and can be regarded as the absolute aromatic hydrocarbon, which exists as a single layer of carbon atoms, bonded together in a two-dimensional, sheet-like hexagonal structure that creates many unique properties. Graphene is practically impermeable to all known chemical substances even atomic hydrogen; thus it provides protection to underlying substrates against all gases inclusive of oxygen and also against water vapor. It also absorbs only 2.3% of visible light absorption, which makes it practically invisible.

Graphene related materials have been found to provide significant shielding of the ultraviolet part of the electromagnetic spectrum as coatings, since a monolayer of graphene absorbs up to three times more in the UV region (190-400 nm) than in the visible region (FIG. 1A). In addition, it is known that chemical molecules such as water or oxygen cannot penetrate a continuous graphene membrane which accordingly provides complete protection against degradation caused by such molecules.

The present invention describes the development of an invisible "veil" such as a graphene membrane of atomic thickness on paintings that can provide protection against UV radiation, moisture, oxygen or any other chemical penetration. According to the invention, the protection of the artworks is achieved by producing and transferring various sizes of graphene layers without defects onto various surfaces used by artists, such as polymers, canvas or paper substrates. Such a protective layer can even be applied to larger three-dimensional structures for which similar protection is desired.

A schematic representation of an especially preferred embodiment of this first aspect of the inventive method is shown in FIG. 1B. According to this first aspect, a graphene membrane which preferably constitutes a graphene monolayer, is formed and transferred onto the surface to be protected. The various process steps and preferred embodiments will be described in more detail in the following.

Step a) of the inventive method includes depositing graphene onto at least one side of a supporting substrate to produce a graphene/substrate composite including a continuous graphene membrane formed on at least one side of said substrate. Step a) is represented by step 1. in FIG. 1B in which graphene is in this embodiment applied onto a copper foil to produce a graphene/Cu foil composite.

A chemical vapor deposition method is preferred for the synthesis of continuous graphene structures as the conditions of production can be controlled in such way as to yield graphene sheets that contain minimal defects such as cracks, gaps or holes. Other methods of applying graphene onto a substrate can also be used within the context of the invention as long as they create a defect-free thin graphene layer, preferably a monolayer.

As the supporting substrate, preferably a metal, polymer or other non-metal material, is used. Advantageously, this supporting substrate is in the form of a flexible sheet or foil. Most preferably, a copper foil or sheet is used as in FIG. 1B.

In another preferred embodiment of the inventive method, after step a), a further supporting layer is applied onto the graphene membrane-bearing side of the graphene/substrate composite. In such preferred embodiment, a layered composite is formed consisting of the graphene membrane enclosed by or sandwiched between the supporting layer and the supporting substrate. A polymer-based backing substrate or adhesive film can be conveniently used as the supporting layer. In an especially preferred embodiment, a pressure-sensitive adhesive film is used as the supporting layer. It is further preferred, to apply the supporting layer via a roll-to-roll coating process or by direct compression transfer (stamping). This preferred embodiment is exemplified as step 2. in FIG. 1B in which an adhesive film is applied to the graphene/Cu foil and fixated by applying pressure. As the polymer-based backing substrate or the adhesive film, a flexible and/or transparent material can be used, which preferably is selected from PET-, PMMA-, and PET/silicone films or membranes.

In a further preferred embodiment, after step a) and, preferably, after the additional step of applying a supporting layer onto the graphene membrane bearing side of the graphene/substrate composite, an oxygen plasma treatment is performed. This additional step is shown as step 3. in FIG. 1B. The oxygen plasma treatment removes graphene which, during the deposition of graphene onto the supporting substrate surface, was inadvertently deposited on the other (opposite) side of the substrate.

In step b) of the inventive method, the graphene membrane is separated from the supporting substrate. This separation can be performed by removing the substrate or by lifting off the graphene membrane from the substrate. In the first case, especially in the context of the preferred embodiment, in which a Cu foil or sheet is used as the supporting substrate and a further supporting layer was applied, this Cu material is conveniently removed by an etching treatment thus leaving a graphene/supporting layer composite. Such treatment is shown as step 4 in FIG. 1.

Any further means or method to separate the composite of supporting layer/graphene/substrate by removing the supporting substrate can also be used within the context of the present invention. Furthermore, any further means or methods of removal or lifting off of the graphene membrane from a supporting substrate, on which the membrane was formed, is also applicable, especially in cases in which an additional supporting layer is not included.

In step c), the obtained graphene membrane is deposited onto the surface to be protected. In a preferred embodiment, this deposition is performed via a roll-to-roll coating or unrolling process. This preferred embodiment is shown as steps 5 and 6 in FIG. 1B where graphene/adhesive film composite is deposited on the painting (or other artwork) and is attached thereto by applying pressure in the roll-to-roll process. As a second alternative, especially in cases in which the structure or size of the artwork prohibits such roll-to-roll coating, also a direct compression (stamping) method can be used to deposit the graphene membrane onto the artwork surface and to attach it thereto. The supporting layer can then easily be removed to result in a very thin protective graphene membrane layer on the artwork surface.

In a preferred embodiment of the invention, the roll-to-roll coating process or the unrolling process are performed under certain conditions which are listed in the following. The important conditions mainly include temperature, pressure and rolling speed. While the various conditions can be applied in combination, it is also possible to apply only one of the conditions as stated and to vary the other two, or to apply two of the stated conditions and to vary the third one. For temperature, the usually preferred range is 45 to 70° C., more preferably 50 to 55° C. For the pressure applied within the process, the preferred value is 0.1 to 10 MPa, more preferably from 0.1 to an upper value of 5, 2, 1 or 0.5 MPa.

Depending on the artwork and the dimensions of the surface to be protected, a continuous graphene membrane is preferably applied, which has dimensions from a few centimeters up to some meters in length and width, and this membrane is deposited to fully or at least partially cover the surface. Within the context of the present invention, it is further possible to apply a membrane consisting of a graphene monolayer, or multiple graphene layers can be used. If a multilayer graphene membrane is used, it can be prepared by depositing several graphene layers onto the supporting substrate in step a), or, alternatively, additional graphene layers can be applied to an adhesive film onto which already a first graphene layer has been deposited in the process as described above. Finally, it is also possible to apply the inventive methods multiple times to transfer multiple graphene membrane layers onto the artwork as a coating.

While it is usually desirable to provide an "invisible veil", in certain circumstances such as in artwork storage, a not completely transparent coating consisting of a thicker membrane can be beneficial to provide even stronger protection. As the protective coating is easily removable, such thicker coating can be especially applied in cases in which temporarily a very high protection is desired or required. Thus, in especially preferred embodiments, in step a) a continuous graphene monolayer or multilayer membrane is formed, and the membrane preferably has a thickness of 0.33 nm (monolayer) to n×0.33 nm (multi-layered). As mentioned above, also a repeated application of the process or transferring of multiple membranes onto the supporting layer can result in a multi-layered graphene membrane.

While the inventive method can be used to apply a protective coating onto any surface, it is nevertheless preferred that the surface to be coated exhibits a surface roughness from 1 nm to 10 µm, preferably a surface roughness of between 80 and 120 nm. Furthermore, it is preferred that the surface has a surface energy of 1 to 100 mN/m, preferably at least 5, 10 or 15 mN/m and up to 90, 80 or 70 mN/m. An especially preferred range is 17 to 64 mN/m. As explained throughout the description of the inventive process, the surface to be protected usually is a two- or three-dimensional artwork or other colored surface. Such surfaces to be coated are preferably selected from the group of canvas, paper, cardboard, photographic paper, wood, polymers, paintings, papyrus, covers of old music vinyl records, cover pages and interior pages of magazines and books, murals, artistic masonry and art installations of any material.

In a more detailed description of a preferred embodiment of the inventive process, a metal substrate (usually a copper sheet) is heated to a high temperature and exposed to precursor gases (hydrocarbons) which react on its surface, to result in a graphene coating on the metal substrate. Using basic starting materials such as methane ($CH_4$), the CVD method has the ability to produce high-quality graphene on a variety of supporting substrates such as metals (Cu, Ni etc.), polymers and non-metals. The process of transferring the graphene from a polymer-based backing substrate such as polyethylene terephthalate (PET) or polymethylmethacrylate (PMMA) onto the surface of an artwork has been developed by the inventors. The inventive roll-to-roll process allows for dry transfer of graphene CVD membranes (both monolayer and few-layers or multi-layers) onto the surface of art materials as shown in FIG. 1B. A further schematic representation of the inventive process including some further relevant information for the various steps is shown in FIG. 2. Paintings with a graphene membrane applied to part of the surface (indicated by arrows) are shown in FIGS. 8A and 9A.

The present invention is highly advantageous since it provides a protective coating especially for artwork, which especially protects colors from fading, but also prevents other detrimental environmental effects. Not only is the application of the graphene membrane onto the artwork easy to perform and does not endanger the artwork itself, but the protective coating can also easily be removed so that it does not irreversibly interfere with the artwork. The protective membrane, mono- as well as multi-layered graphene membranes, can for example be removed dryly by means of a soft rubber eraser or similar methods of ablation without damaging the integrity, especially the optical integrity, of the artwork. An additional advantage is that the present invention provides protection at an affordable price since the required graphene quantities are minimal.

Graphene-coated samples have been exposed to ultraviolet and visible radiation and to accelerated environmental conditions. Results from such experiments show that graphene reduces Delta E by about half, compared to a sample that has no graphene coating. Delta E is the most commonly used index for color change, a low Delta E represents less color change (e.g. FIGS. 5A and B). The experimental results also showed that, while the monolayer graphene provides very good protection against the discoloration of paintings, the percentages of protection increase as the graphene layers increase. Also, a similar decrease in the membrane's transmittance is observed, which may not be desirable in certain uses. Accordingly, it will depend on the actual use and the actual artwork or surface to be protected, whether a graphene monolayer membrane or multiple graphene layers are used in a certain context.

The observations of the inventors during the development of the above described method showed that the method as well as the protective graphene coating prepared and deposited according to this method provides protection for a surface, especially at two- or three-dimensional artwork or any colored surface, against color degradation, especially fading, yellowing and discoloration due to exposure to UV radiation. It also provides protection against accumulation of dirt or dust, or a negative influence by moisture as well as chemical and/or oxidizing agents contained in the environment surrounding the artwork or colored surface. Accordingly, the use of such method or of a graphene membrane prepared and applied to the artwork according to the above described method or by any other method for such protection of a surface, especially a two- or three-dimensional artwork or any other colored surface, against any of such detrimental effects is a further subject of the present invention.

In a second aspect of the present invention, the negative effects on artwork are prevented by incorporation of graphene-based materials and/or boron nitride into aqueous or organic media based dispersions. Graphene-based materials, preferably graphene or graphene oxide and/or boron nitride can be included into such dispersions as powders or solutions. Powders can be used for aqueous and organic media based dispersions whereas solutions are usually used within the context of aqueous media based dispersions. The powders and solutions are included into such dispersions at a concentration and providing stability which is appropriate for the application as paints, dyes, inks, pigments, varnishes etc. used for artistic purposes. In other words, the graphene and/or boron nitride are included in paints and the like to create indelible colors in which color degradation, especially color degradation due to exposure to UV radiation, moisture and oxidizing agents, is prevented.

This second aspect of the invention is based on the realization that especially graphene and graphene oxide, but also boron nitride have a color-protective effect even if they are directly included into the materials used for creation of an artwork. Also for this aspect of the invention, experiments have shown that exposure to ultraviolet and visible radiation as well as further accelerated environmental conditions reduces Delta E considerably, usually by about half. Consequently, by use of such graphene or boron nitride containing materials, the artworks are protected from the time of their creation and deterioration of the artworks can be delayed or even prevented ab initio.

To this purpose, graphene, graphene oxide as well as boron nitride can be added into the respective dispersions in useful and advantageous amounts which can easily be determined by the skilled person. In preferred embodiments of the invention, the graphene-based material or boron nitride is included in an amount of 0.1 to 5% w/w and more preferably in an amount of at least 0.5% w/w and up to 3% w/w. All amounts between the above mentioned limits are also included and considered as preferred embodiments.

The following figures and examples are provided to further illustrate the invention.

EXAMPLES

Example 1

Production of Graphene Veils

Figure 3:
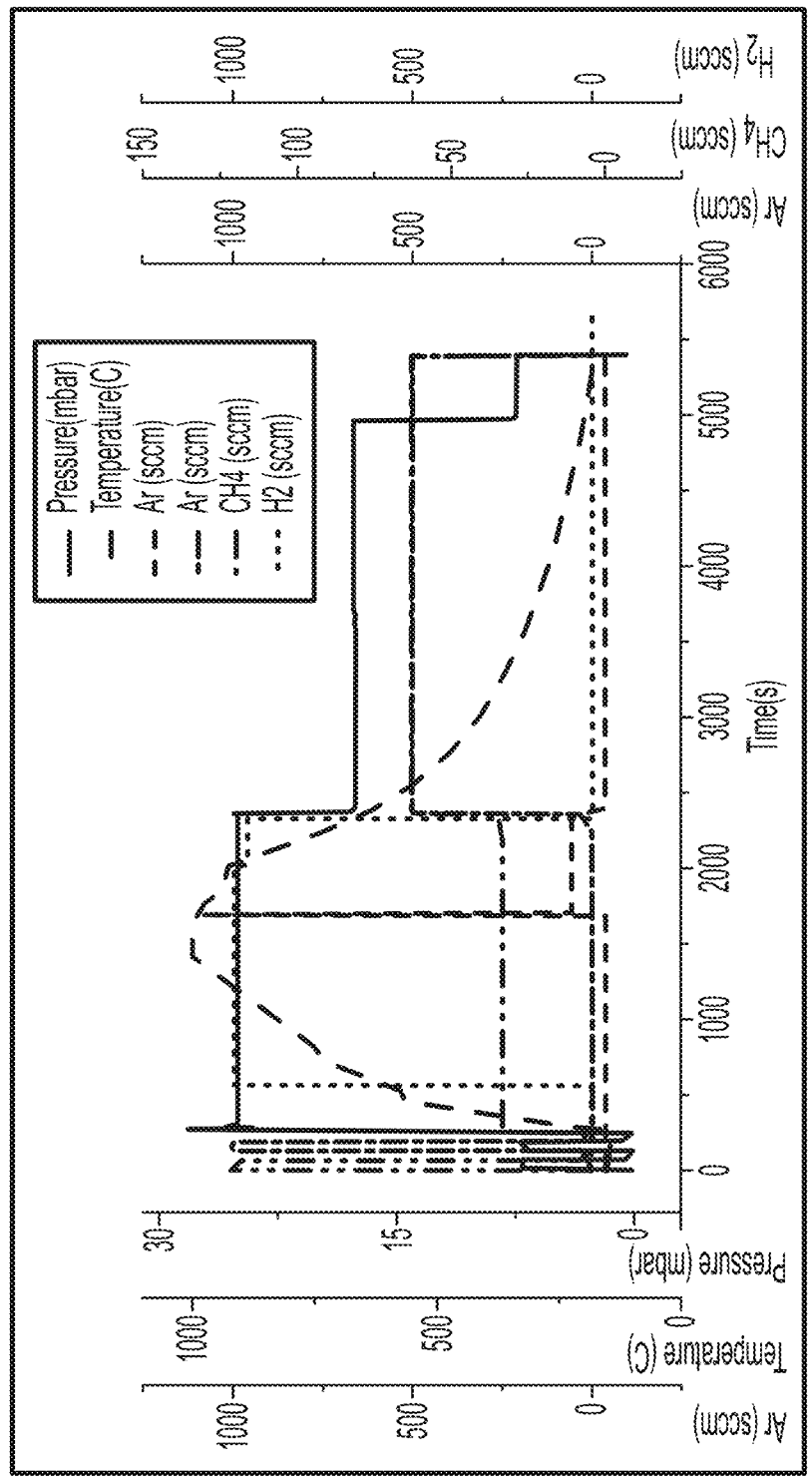
FIG. 3: The fluctuation of several parameters related to the growth of CVD graphene onto copper foil.

The graphene monolayers are synthesized on copper foils in an AIXTRON® BM Pro CVD chamber. A high quality copper substrate supplied by Viohalco® was used as the catalyst substrate. For the graphene production, the foil is cut into 7×7 cm2, cleaned by isopropanol to remove any organic contamination and introduced into CVD chamber. After the closure of the chamber, it is immediately pumped down to 0.1 mbar and then a mixture of argon/hydrogen (Ar/H2) gases is introduced (250 sccm/50 sccm) with a pressure below 25 mbar. The foil is heated in 1000° C. and is kept there for 5 min for annealing. Afterwards the sample is cooled down to 925° C., while methane (CH4) is introduced into chamber (10 sccm) as carbon feedstock to initiate the graphene growth on copper foil surface. After 5 min, the $H_2$ flow is terminated, the chamber is cooled down to 650° C. and the $CH_4$ flow is also terminated. Then the chamber is cooled down to room temperature under an Ar atmosphere. FIG. 3 illustrates the fluctuation of applied pressure, temperature and gases flow.

Example 2

Graphene Transfer Method

Figure 1A:
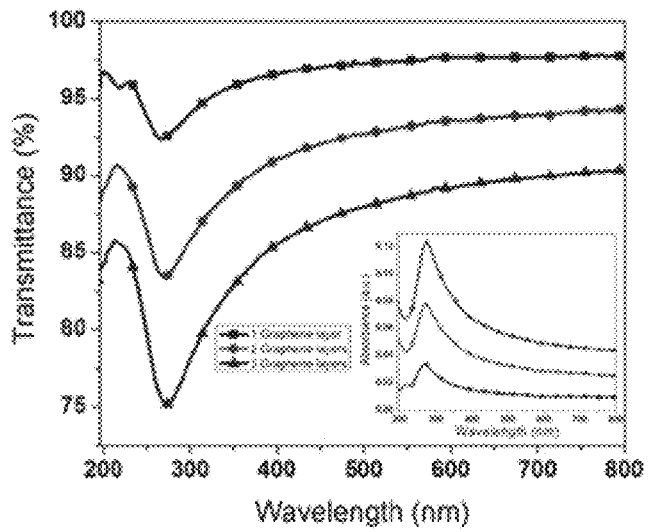
FIG. 1A: Transmittance spectra of a graphene veil with increasing number of layers, synthesized with CVD method. Inset: The corresponding absorption spectra in absorbance units (a.u.).
Figure 1B:
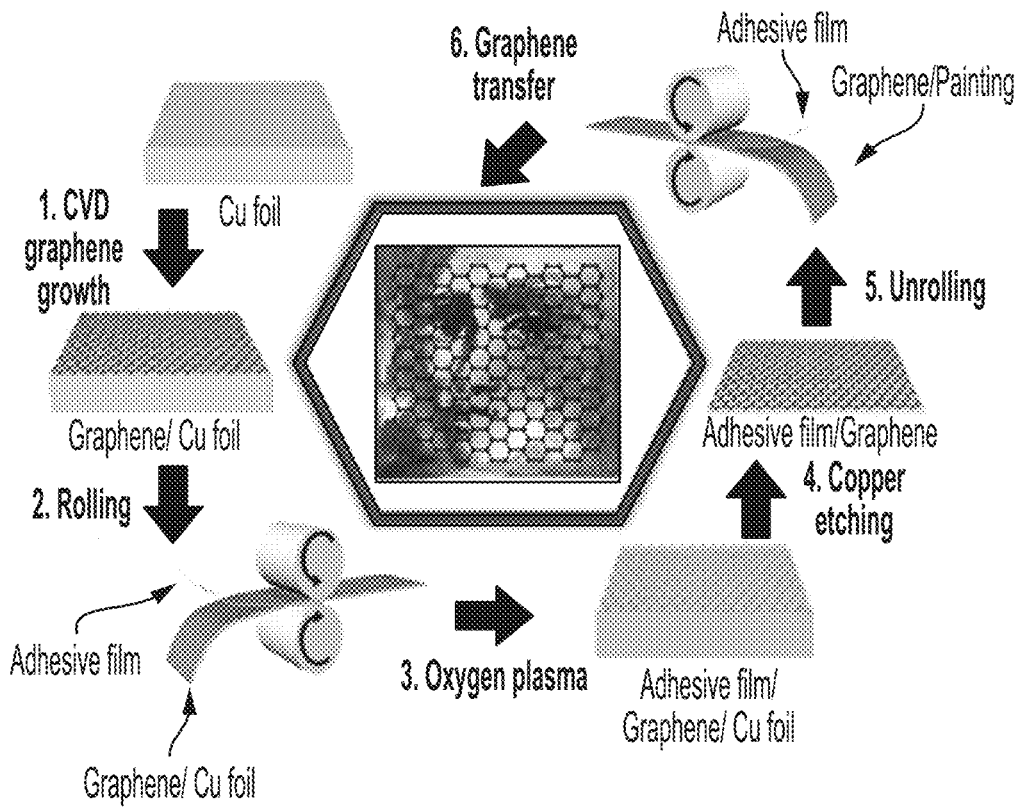
FIG. 1B: Schematic illustration of the roll-to-roll method used to transfer graphene onto mockups and real artworks.
Figure 2:
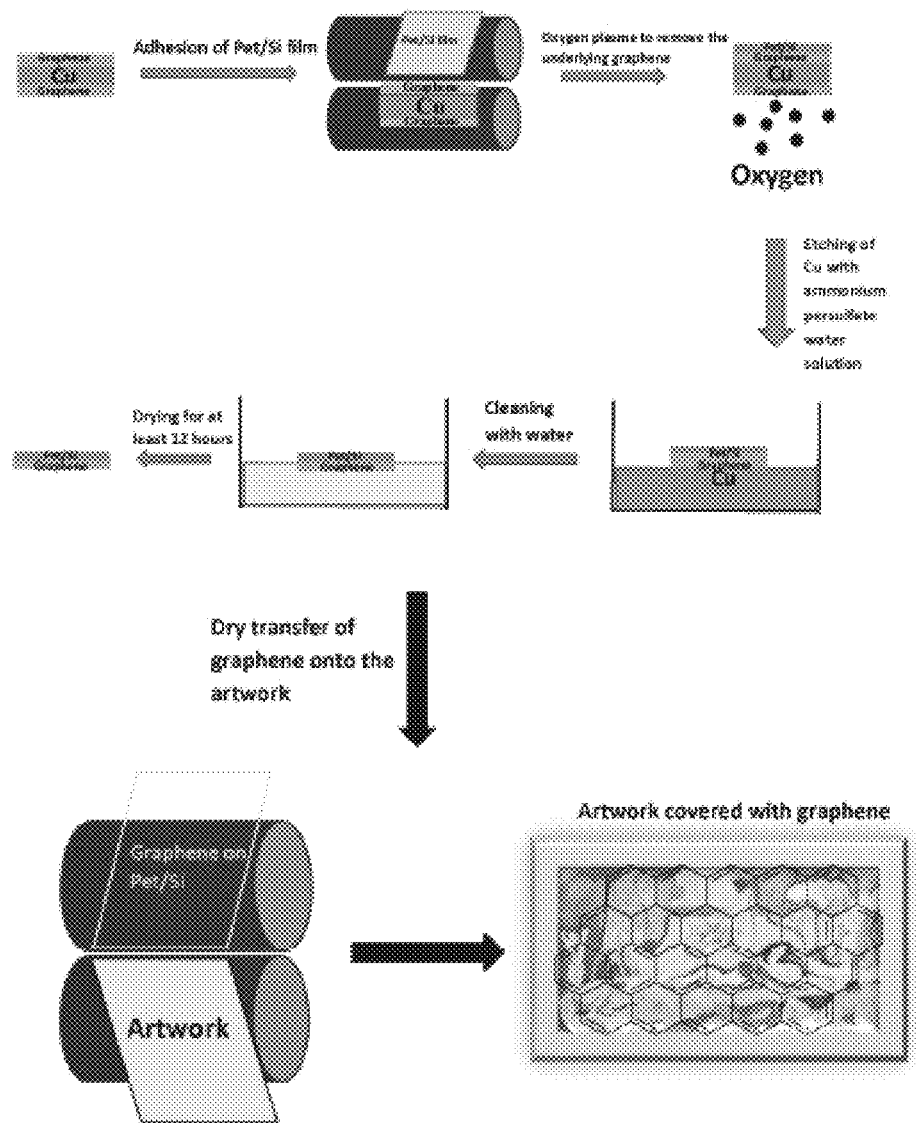
FIG. 2: A further schematic illustration of the inventive method.
Figure 4:
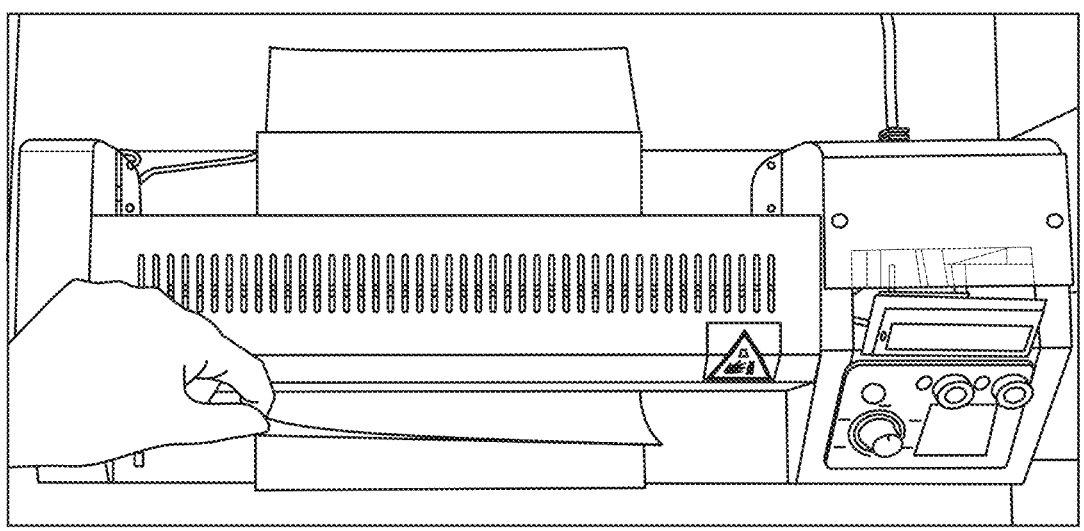
FIG. 4: Final configuration for the laminator. The modified laminator was the basic instrument for dry roll-to-roll graphene transfer onto artworks.

The roll-to-roll method (Kim, S. J., et al., *Ultraclean Patterned Transfer of Single-Layer Graphene by Recyclable Pressure Sensitive Adhesive Films. Nano Letters*, 2015. 15(5): p. 3236-3240) without the use of solvents or chemicals is ideal for graphene deposition without damaging the artworks. For that reason, a tailor-made roll-to-roll machine based on a commercial laminator was designed and built. The whole procedure is shown in FIG. 1B. Firstly, CVD graphene is cleaned from dust, dirt or/and water molecules by purging nitrogen gas on its surface. Then, the specimen is attached to one side of a commercial flexible PET/Silicone membrane by employing the roll-to-roll machine (FIG. 4), at a rolling speed of 0.195-0.325 mm/sec and pressure of 0.1-0.5 MPa. The PET/Silicone film was chosen as a backing substrate because it adheres well to the copper sheet with the graphene on top of it and is transparent and flexible. Also, it is resistant to aggravating agents of subsequent processing steps (oxygen plasma, etching, and pressure—transfer temperature). Then, the graphene deposited on the other side of the membrane is removed by oxygen plasma. Subsequently a water solution of 0.1 M ammonium persulfate is used to etch the copper, and afterwards, deionized water is used to clean any remaining dirt or residue of the ammonium persulfate. The PET/Silicone/graphene membrane is left for at least 8 hours inside a vacuum chamber in order to be de-hydrated. Afterwards, the membrane is ready to be transferred onto paper substrate. For the graphene transfer, the reverse procedure of rolling, i.e. unrolling (FIG. 1B), is performed, using the same parameters indicated above, at a temperature of 50-55° C. For the deposition of bi-, tri- or multi-layered membranes, we iterated the same procedure so to have non-Bernal stacked multilayers.

The dry transfer method is based on the use of pressure-sensitive adhesive films (PSAF), like the PET/Silicone membrane as supporting layer. It takes advantage of the difference in wettability and adhesion energy of graphene with respect to PSAF and the target substrate. Then, the PSAF layer is simply peeled off from the target substrate, thus leaving the graphene membrane on the substrate. The basic parameters which define the success of the transfer process are estimated to be the transfer rate, temperature and pressure. Empirically, we have observed that the lower the transfer rate, the more effective the graphene transfer is. Finally, it was observed that mild heating to 50-55° C. has positive effect on the transfer quality. Such an effect is attributed to the change of surface properties of PET/Silicone since its surface energy decreases by the thermal treatment. For the graphene membranes, the transfer process must be performed at a slow rate to ensure the homogeneous heating to the desirable temperature by the laminator's rollers of graphene and the substrates. Regarding the transfer pressure, it is noticed that application of high pressure between the rollers results in a homogeneously transferred graphene film. Hence, the design of the laminator has been performed based on the above parameters and findings. A commercial cold/hot laminator FJK 320 was modified in order to be used as the roll-to-roll transfer system. The system could operate up to 180° C. and the initial motor's speed was 3.5 rpm which corresponds to a linear velocity of 9.2 mms$^{-1}$, since the rollers' diameter is 2.5 cm. The measured speed was much higher than that required for the given application, so the initial motor was replaced by the NEMA-17 stepper motor with an integrated planetary gearbox with a 99.51:1 drive ratio. The final configuration of the as-modified laminator is presented at FIG. 4.

Example 3

Removal of Graphene Veils

Figure 5A:
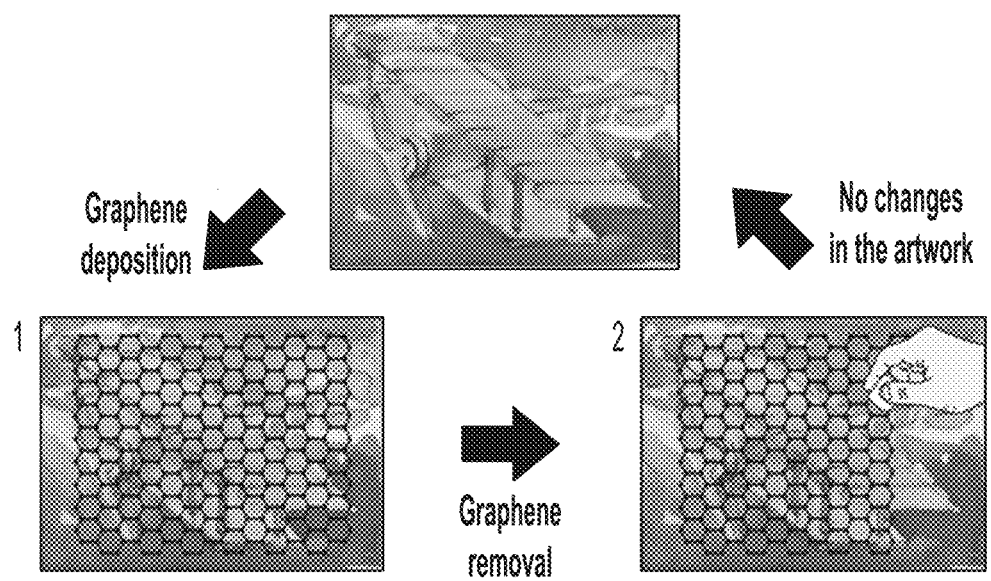
FIG. 5A: A scheme showing the deposition and subsequent removal of graphene from "Biplane, Handley Page H. P. 42" using a soft rubber eraser.
Figure 5B:
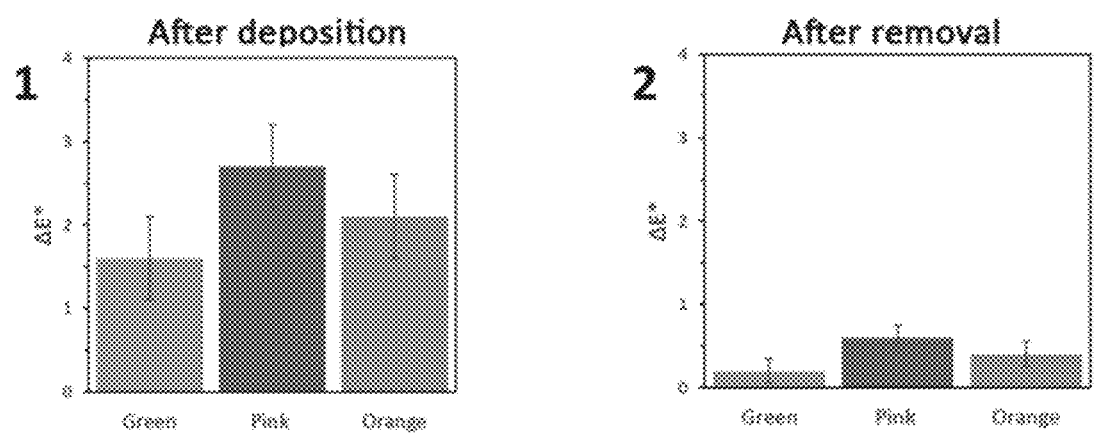
FIG. 5B: Colorimetric data acquired during the process of graphene deposition and removal, clearly showing that the veil is almost not visible or just noticeable on different colors, and it can be removed without damaging the optical integrity of the artwork.

In art conservation, the reversibility of the treatment is mandatory for any intervention, especially in the case of paintings and graphical artworks. Graphene adheres to surfaces via weak bonds, and this should favor its removability*. Therefore, to verify our hypothesis, we deposited on "Biplane, Handley Page H. P. 42" a single layer of CVD graphene, and then we removed the protective coating, by means of a soft rubber eraser (see FIG. 5A). To assess the effect of removal, colorimetric coordinates (ΔE*) were recorded on three colored spots before and after graphene deposition, and after the removal of the veil (see FIG. 5B). The values measured were close to zero bearing also in mind that the statistical error of the colorimeter is ±0.5, which proves that the process is reversible, and the graphene veil can be easily removed without damaging the optical integrity of the artwork.

Example 4

Preparation and Characterization of Mockups and Real Artworks

General Information about Colorimetric Measurements:

Colorimetric coordinates are extracted from reflectance spectra using standard illuminant D65 and a standard observer at 10° (CIE 1964, G. Wyszecki, W. S. Stiles, *Color Science: Concepts and Methods, Quantitative Data and Formulae*, John Wiley & Sons, New York, NY, ed. 2nd, 2000; http://eu.wiley.com/WileyCDA/WileyTitle/productCd-0471399183.html). The color difference between samples can be expressed in terms of the ΔE* parameter, calculated from the colorimetric coordinates and L*, a*, and b* as follows*:

$$\Delta E^* = \sqrt{(L^*_2 - L^*_1)^2 + (a^*_2 - a^*_1)^2 + (b^*_2 - b^*_1)^2}$$

To compare the colorimetric coordinates after the aging, of not protected and protected with graphene samples, we calculate a Protection Factor (PF), according to:

$$PF\ (\%) = \left( \frac{\Delta E^*_{color\ without\ graphene} - \Delta E^*_{color\ with\ graphene}}{\Delta E^*_{color\ without\ graphene}} \right) * 100$$

Detail about the preparation, characterization and aging of mockups and real artworks are reported below.

Paper Mockups Featuring a Blue Dye: Preparation, Characterization and Aging:

Filter paper disks (Whatman n.1; 99% made with cotton fibers; paper density=88.0 g/m2; diameter=55 mm) were used to prepare paper mockups. On each disk, 2 mL of a Methyl Blue (Sigma-Aldrich; product number: M6900) aqueous solution at 2.5% (w/w) was applied using a micropipette. Samples were left to dry under the hood for 48 hours. On each sample, graphene veils of 1, 2 and 3 layers (3.5×3.5 cm2) were deposited, using the roll-to-roll method described elsewhere. Graphene appears to be following the pattern of the surface with no apparent gaps or cracks. A not protected sample was used as a reference. Before and after deposition, reflectance spectra were acquired using a Cary 100 UV-VIS spectrophotometer, working in a λ range of 400-700 nm (with 1 nm of resolution), equipped with an integrating sphere having a circular sampling spot (diameter=1.5 cm). The error related to ΔE* values obtained using this instrument is ±0.5.

All the samples were then artificially aged in an in-house built aging chamber, equipped with three Neon Light Color 765 BASIC Daylight Beghelli neon lamps. The average illuminance was 11000 Lux, RH was 40% and temperature was 36° C. The aging lasted 4 weeks. A portion of each sample was covered during the aging, to be used as a reference. Every week, reflectance spectra were acquired as indicated above. Colorimetric coordinates were obtained as described above. After aging, the transferred graphene does not show any macroscopic defects such as cracks or holes. Data obtained on these set of samples are reported in Table 1.

TABLE 1

ΔE* after graphene deposition and PF for the paper mockups featuring the blue dye.

| Sample | ΔE* after deposition | Protection Factor (%) |
|---|---|---|
| MB + 1 graphene layer | 2.2 | 6.9 |
| MB + 2 graphene layers | 3.0 | 8.0 |
| MB + 3 graphene layers | 3.4 | 9.8 |

Paper Mockups Featuring a Pink Dye: Preparation, Characterization and Aging:

Cardboard (Bristol type) was used to prepare paper mockups. A pink ink Carmine Pelikan drawing ink) was applied on the samples using a paintbrush. Samples were left to dry under the hood for 24 hours. On each sample, a monolayer graphene veil (7×7 cm2) was deposited, using the roll-to-roll method described elsewhere. Some samples were not protected with graphene and were used as references.

The samples were then artificially aged in an in-house built aging chamber, equipped with seven lights panel emitting white light. The aging lasted 70 hours. The bottom part of each sample was covered during the aging. At the end of the aging, the graphene was removed from the samples as described in Example 3.

Figure 6:
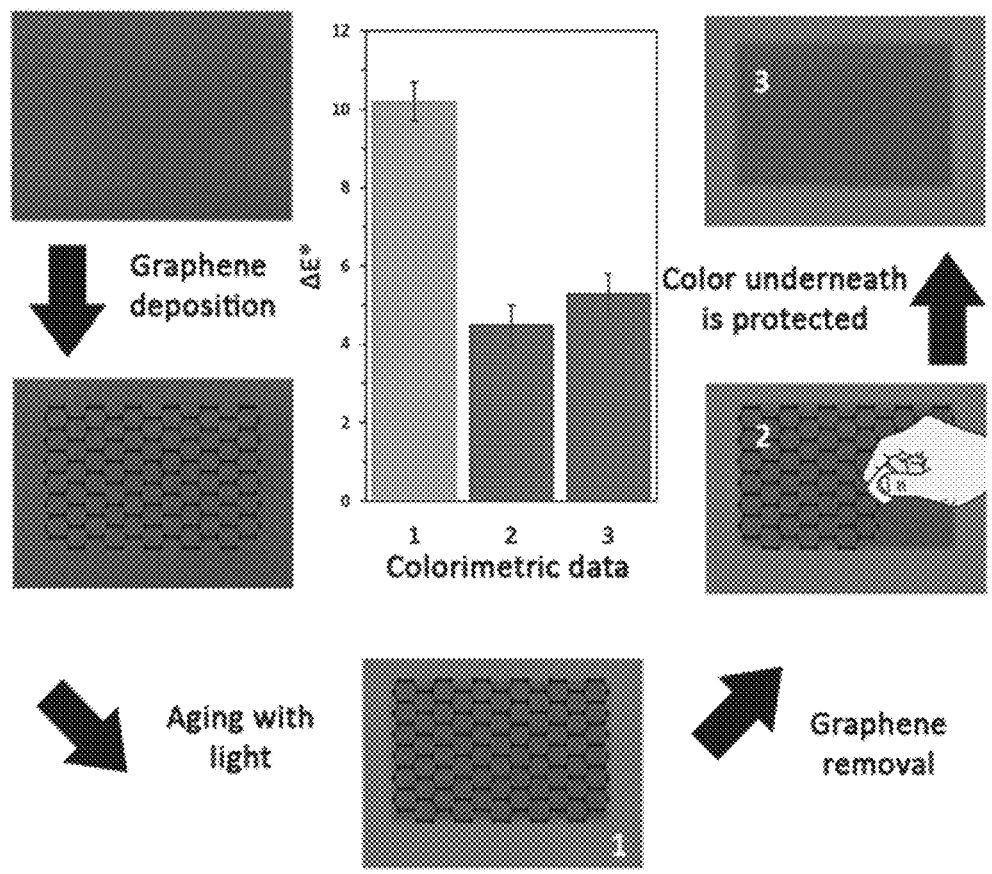
FIG. 6: A Collage showing paper mockups featuring a pink dye, which were protected with graphene and then aged under white light. The color that was not protected by graphene displayed a ΔE* of about 10.2 (Sketch 1) after 70 hours. When graphene is present, the ΔE* at the end of the aging is around 4.6 (Sketch 2). Just after the removal of graphene using a rubber eraser (FIG. 3), a similar ΔE* of 5.4 was recorded, which clearly demonstrates that the presence of graphene did not have any deleterious effect on the color underneath (Sketch 3).
Figure 7:
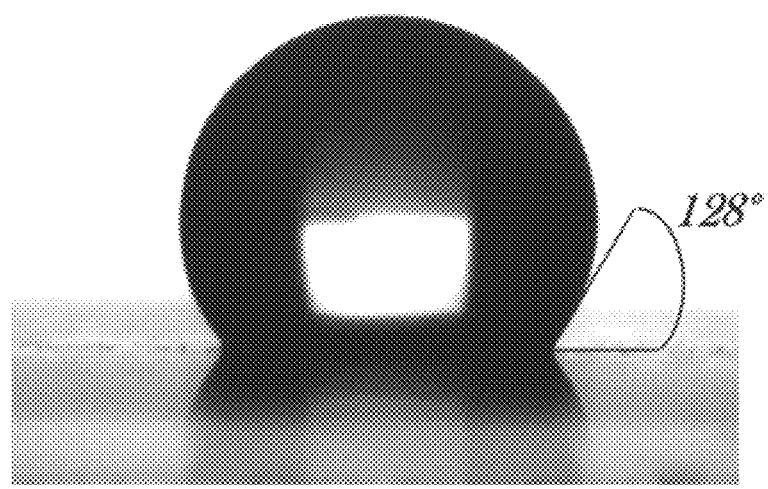
FIG. 7: Contact angle of water on cardboard with monolayer CVD graphene. The angle reaches 128° when the monolayer is deposited onto the paper, from full wetting and absorption (0°) when graphene is absent.

Before and after deposition, upon aging, and after the removal of graphene, reflectance spectra were acquired using FRU WR-10 portable colorimeter. Colorimetric coordinates were obtained from reflectance spectra as described previously. The error related to ΔE* values obtained using this instrument is ±0.5. In FIG. 6, and Table 2, pictures and data about the experiments conducted on these mockups are reported.

TABLE 2

ΔE* of paper mockups featuring the pink ink, after aging, before and after the removal of graphene. Please note that the difference in ΔE* between samples before and after removal of the graphene, especially at lower aging times, is close to the experimental error. Nevertheless, the ΔE* are significantly lower than those shown by the unprotected reference system, demonstrating that the color underneath the graphene veil is indeed protected.

| Sample | ΔE* (20 h) | ΔE* (50 h) | ΔE* (70 h) |
|---|---|---|---|
| Reference | 5.7 | 8.4 | 10.2 |
| Sample protected with graphene | 2.2 | 4.4 | 4.6 |
| Sample protected with graphene after its removal | 2.0 | 3.6 | 5.4 |

Contact Angle Measurement of Water on Cardboard with a Deposited Monolayer Graphene:

Contact angle measurements were performed by a KRÜSS DSA 100 contact angle meter, and, the used liquid was distilled water. Sessile drop method was used while each point was being measured three times to calculate average value. The used cardboard was the same described in the previous paragraph. Graphene was transferred onto the cardboard with the procedure described above in Example 2.

Example 5 a) "Triton and Nereid": Characterization and Aging

"Triton and Nereid" has been donated by a Greek artist (Mrs. Matina Stavropoulou (http://www.gallery7.gr/website/painting/matina-stavropoulou/)). It has been realized with Indian inks on glossy paper placed over a canvas support. It measures approximately 20×20 cm². To perform our experiments, half of the artwork was protected with a monolayer graphene using the roll-to-roll method described elsewhere. Graphene appears to be following the pattern of the painting surface with no apparent gaps or cracks.

The artwork was then artificially aged in an in-house built aging chamber, equipped with seven lights panel emitting white light. The aging lasted 1050 hours. A portion of the artwork was covered during the aging, to be used as a reference. After aging, the transferred graphene does not show any macroscopic defects such as cracks or wrinkles.

Reflectance spectra were acquired using FRU WR-10 portable colorimeter. Colorimetric coordinates were obtained from reflectance spectra as described in Example 4. The error related to ΔE* values obtained using this instrument is ±0.5. In Table 3, data about the experiments conducted on this artwork are reported.

Figure 8A:
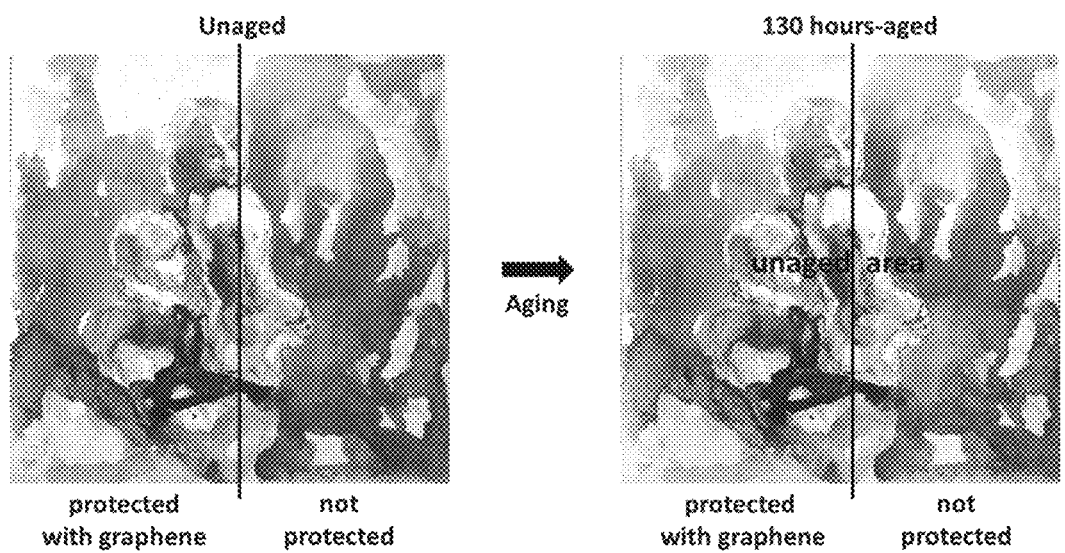
FIG. 8A: The painting entitled "Triton and Nereid"* before and after 130 hours of aging under visible light. A central area was covered during the aging to be used as a reference. The difference induced in the light blue areas (upper left, protected, and in the middle and right, not protected) is shown after 130 hours of artificial aging.
Figure 8B:
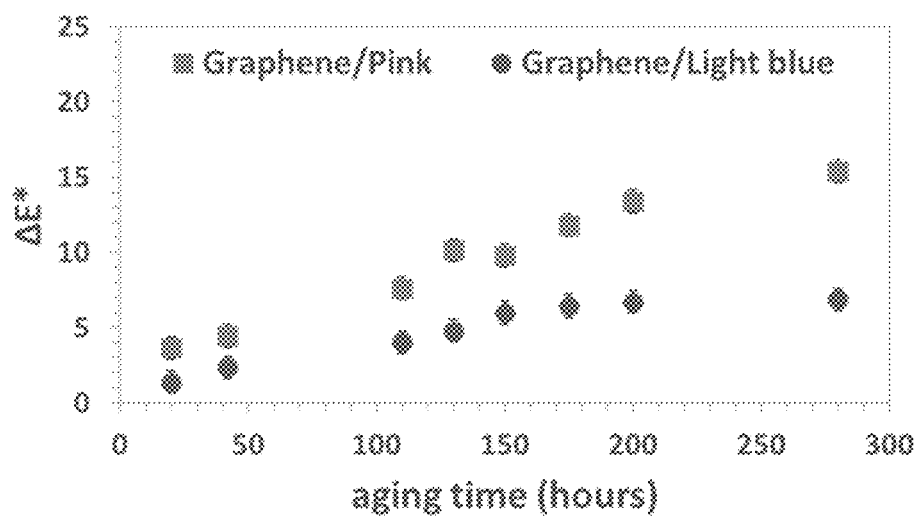
FIG. 8B: Colorimetric data acquired on pink (middle-up on the left, protected, and in the middle-down on the right, not protected) and light blue (the one described in FIG. 8A) dyes upon aging, on not protected (left) and protected with graphene (right) areas.
Figure 8B:
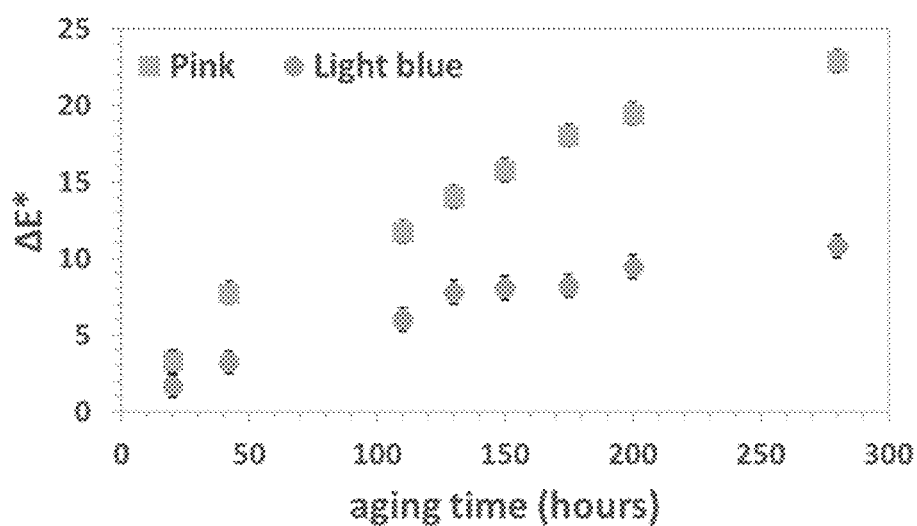

The color changes of light blue and pink dyes in the protected and not protected areas were monitored over time and are reported in FIG. 8B. An overall protecting factor (PF) for the light blue dye of about 38.5% was obtained after 130 hours of exposure, as shown in FIG. 8A. The different amount of aging of the two spots can be ascribed to the fact that the light blue one is probably composed of a single dye, while the so-called pink, features different dyes, with different resistance to fading. Nevertheless, PF is about 35% for light blue color after 1050 hours of aging.

TABLE 3

ΔE* and PF for the selected colors of "Triton and Nereid".

| Color | ΔE* after aging | Protection Factor (%) |
|---|---|---|
| Violet | 16.9 | 19.0 |
| Graphene/Violet | 12.1 | |
| Pink | 14.0 | 27.5 |
| Graphene/Pink | 10.1 | |
| Light Blue | 7.8 | 38.5 |
| Graphene/Light Blue | 4.8 | | b) "Resistance": Characterization and Aging:

"Resistance" has been donated by a Greek artist (Mrs. Matina Stavropoulou (http://www.gallery7.gr/website/painting/matina-stavropoulou/)). It has been realized with Indian inks on glossy paper placed over a canvas support. It measures approximately 20×20 cm2. To perform our experiments, half of the artwork was protected with a monolayer graphene using the roll-to-roll method already described.

Graphene appears to be following the pattern of the painting surface with no apparent gaps or cracks.

Figure 9A:
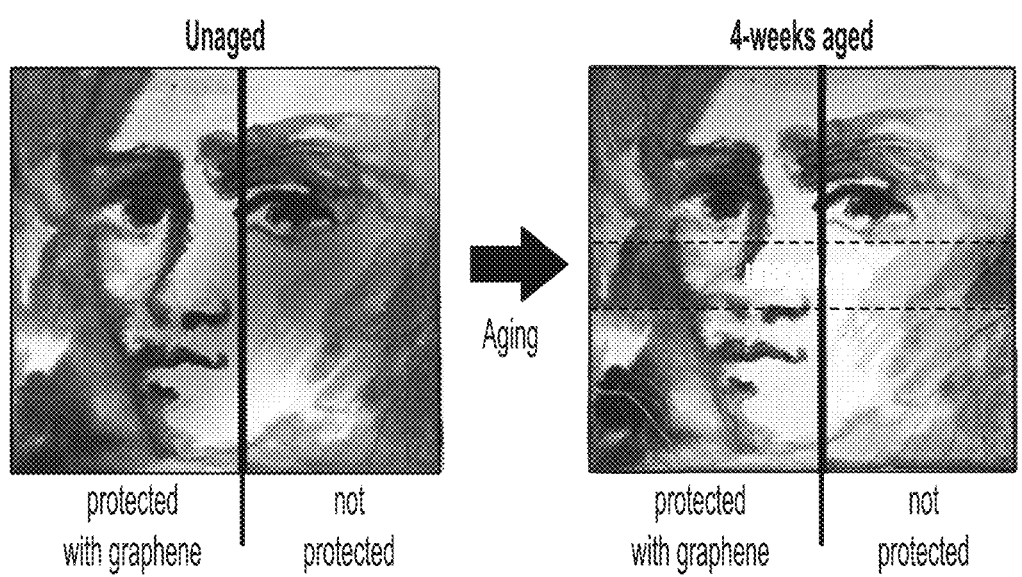
FIG. 9A: The painting entitled "Resistance"* before and after 4 weeks of aging under neon light. A central area was covered during the aging to be used as a reference. The difference induced in the pink areas (upper left, protected, and lower right, not protected) is shown after 4 weeks of artificial aging.

The artwork was then artificially aged in an in-house built aging chamber, equipped with three Neon Light Color 765 BASIC Daylight Beghelli neon lamps. The average illuminance was 11000 Lux, RH was 40% and average temperature was 36° C. The aging lasted 16 weeks. A portion of the artwork was covered during the aging, to be used as a reference. Every two weeks, colorimetric coordinates on different spots were recorded using a X-RITE SP60 VIS portable spectrophotometer, with an integrating sphere having a circular sampling spot (diameter=1.5 cm). The error related to ΔE* values obtained using this instrument is ±0.75. After aging, the transferred graphene does not show any macroscopic defects such as cracks or holes. In FIG. 9, pictures and data about the experiments conducted on this artwork are shown.

Figure 9B:
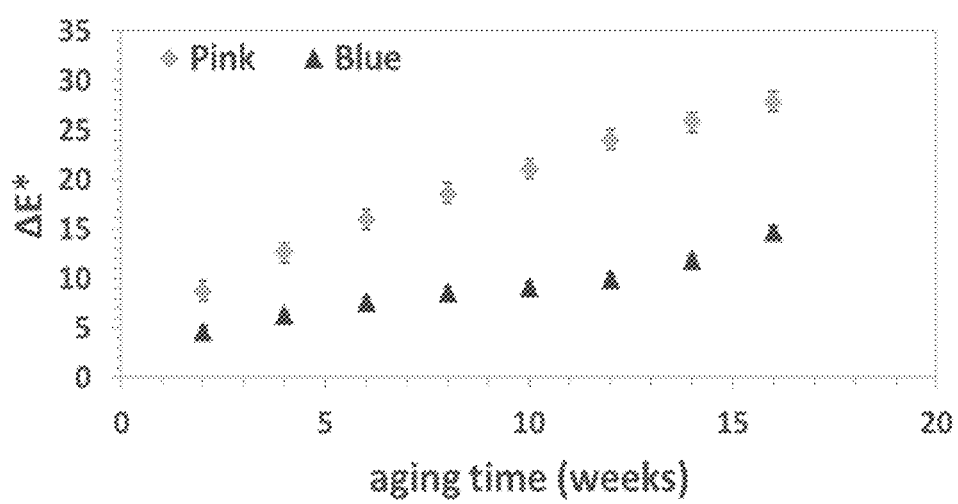
FIG. 9B: Colorimetric data acquired on blue (up at the middle on the left, protected, and in the up at the middle on the right, not protected) and pink (the one described in FIG. 9A) dyes upon aging, on not protected (left) and protected with graphene (right) areas.
Figure 9B:
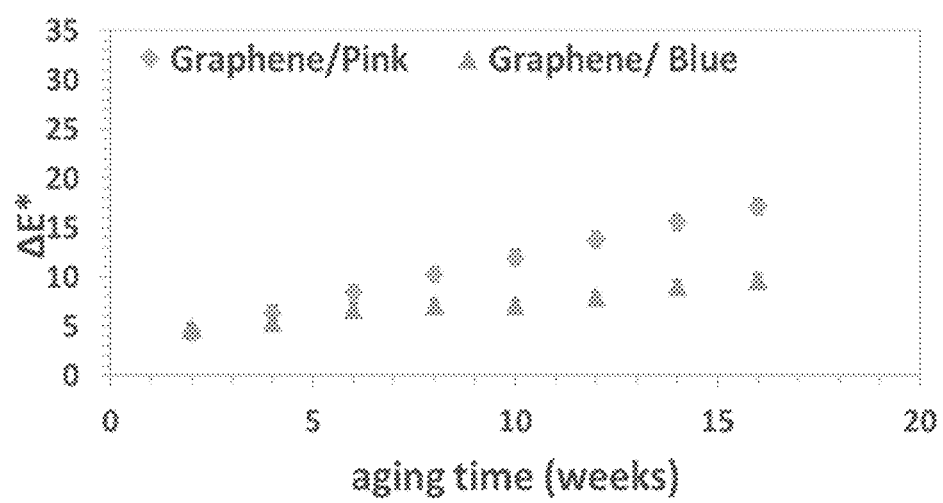

The color changes of blue and pink dyes in the protected and not protected areas were monitored over time and are reported in FIG. 9B. An overall protecting factor (PF) for the pink dye of about 49% was obtained after four weeks of exposure. PF is about 35% for both colors after four months of aging. This clearly demonstrates the effectiveness of a monolayer graphene in the protection of highly light-sensitive dyes from fading.

TABLE 4

ΔE* and PF for the selected colors of "Resistance".

| Color | ΔE* after aging | Protection Factor (%) |
|---|---|---|
| Pink | 27.8 | 46.7 |
| Graphene/Pink | 14.8 | |
| Dark Blue | 17.2 | 43.6 |
| Graphene/Dark Blue | 9.7 | |

Example 6

Creation of Graphene-Based Inks and Evaluation of their Aging or Fading Under UV Exposure For the creation of graphene-based inks, commercial inks of a known brand (Pelikan) were exploited, which are used by many professionals and amateur artists. Particularly, Ultramarine (blue) and Carmine (pink) inks were examined. Firstly the ink, then the graphene nanoplatelets (GNPs, powder) were weighed and afterwards the GNPs were added into the ink. Subsequently, an ultrasonic bath sonication for 3 minutes was performed in order to obtain the graphene-enhanced ink, with a known % w/w concentration. GNPs were Elicarb® graphene nano-powder produced by liquid exfoliation of graphite and supplied by Thomas Swan & Co. Ltd. This material consists of few layer graphene platelets, with typical lateral size of 5 μm [http://thomas-swan.co.uk/wp-content/uploads/2017/09/Elicarb-Graphene-Products-Advanced-Materials-LR.pdf]. From this series, specifically the powder coded as Electrical Grade of smaller flake size (~3 μm) was used which results from an additional process step for removing any residual surfactant that was employed to assist graphene dispersion.

For the creation of graphene-oxide based inks, graphene oxide synthesized in the lab was used. The GO was synthesized from natural graphite flakes (NGS Naturgraphit GmbH, Germany) by a two-step oxidation process. At the beginning, 10 g natural graphite flakes were added in 75 ml concentrated sulfuric acid ($H_2SO_4$ 96%) in a flask. The flask was placed in a bath and heated at 80° C. After that, 5 g potassium persulfate ($K_2S_2O_5$) and 5 g phosphorus pentoxide ($P_2O_5$) were added in the solution. The mixture was stirred for 1 h at this temperature and then allowed to cool at room temperature in a period of 5 h. The reaction was terminated by carefully adding deionized water (DW), followed by several steps of vacuum filtration with DW, drying. The oxidized graphite was then subjected to oxidation by modified Hummer's method, where the powder was stirred continuously into a flask with 220 ml $H_2SO_4$ 96%, in a water bath. Gradually, 26.7 g potassium permanganate ($KMnO_4$) was added in the mixture. Thereafter, the mixture was heated to 40° C. for 2 h, where 1.8 liters DW were added carefully, followed by 22 ml hydrogen peroxide ($H_2O_2$ 30%). Then the mixture was filtered and washed with 1:10 HCl solution in order to remove most of the metals ions. The solid product of this process was redispersed in DW to reduce its concentration until its pH becomes the same with DW's pH. Finally, single and few layers of GO were collected by a combination of ultra-sonication and centrifugation steps.

The graphene-oxide solution with a known concentration in water was weighed, and then incorporated in the same before-mentioned inks, blue and the pink one. Subsequently, an ultrasonic bath sonication for 3 minutes was performed in order to obtain the graphene oxide-enhanced ink, with a known % w/w concentration.

Figure 10A:
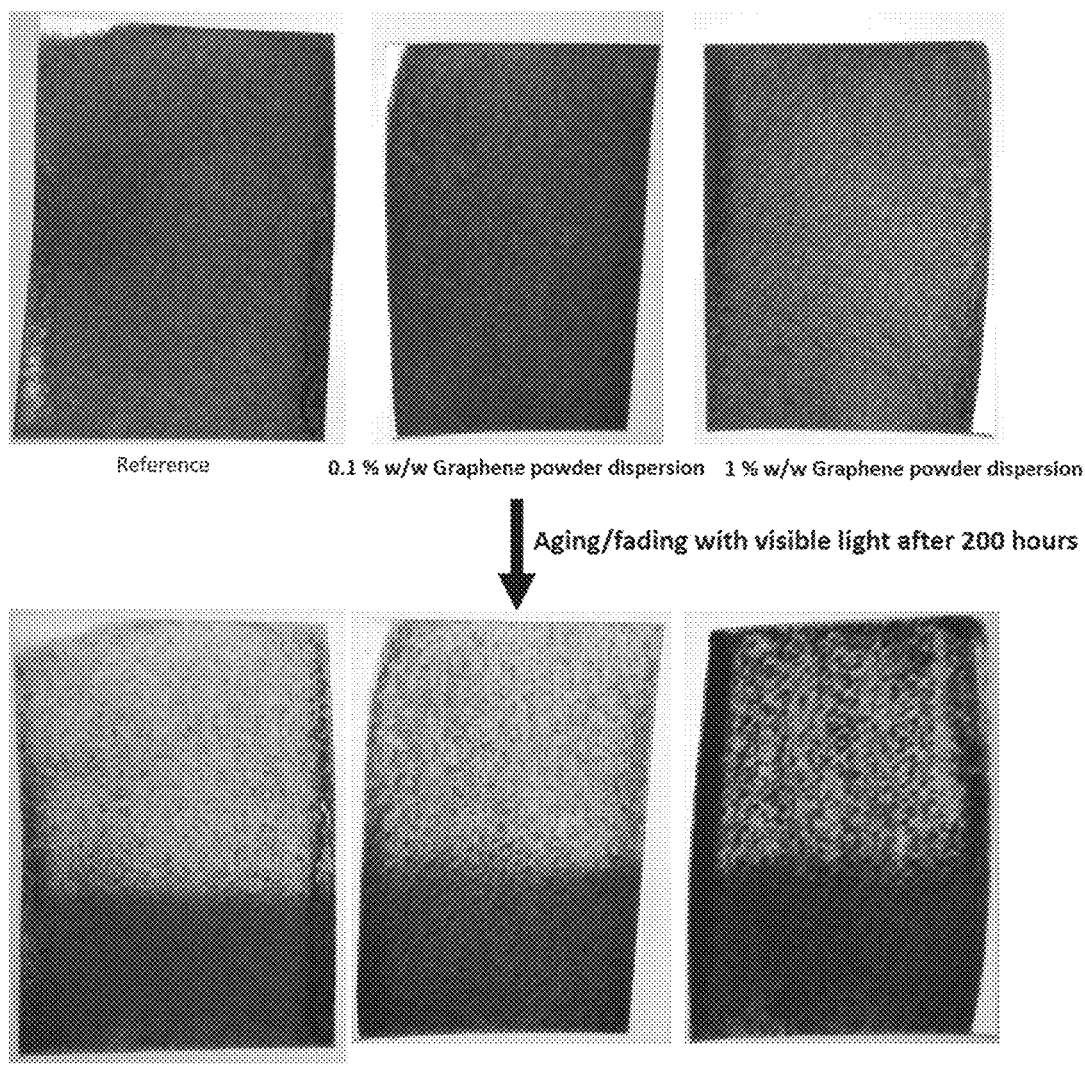
FIG. 10A: Paper mockups dyed with blue ink (Ultramarine) of Pelikan brand featuring graphene. Up: From left to right, a reference sample (without graphene) and samples with 0.1% w/w and 1% w/w graphene powder dispersion. Down: The same dyed papers after an aging of 200 hours with white/visible light. Please note that the lower part of the samples was covered by a thick cardboard paper in order to have an unaged area, as reference. It is obvious that all samples are faded, but as graphene concentration increases, the fading is less.
Figure 10B:
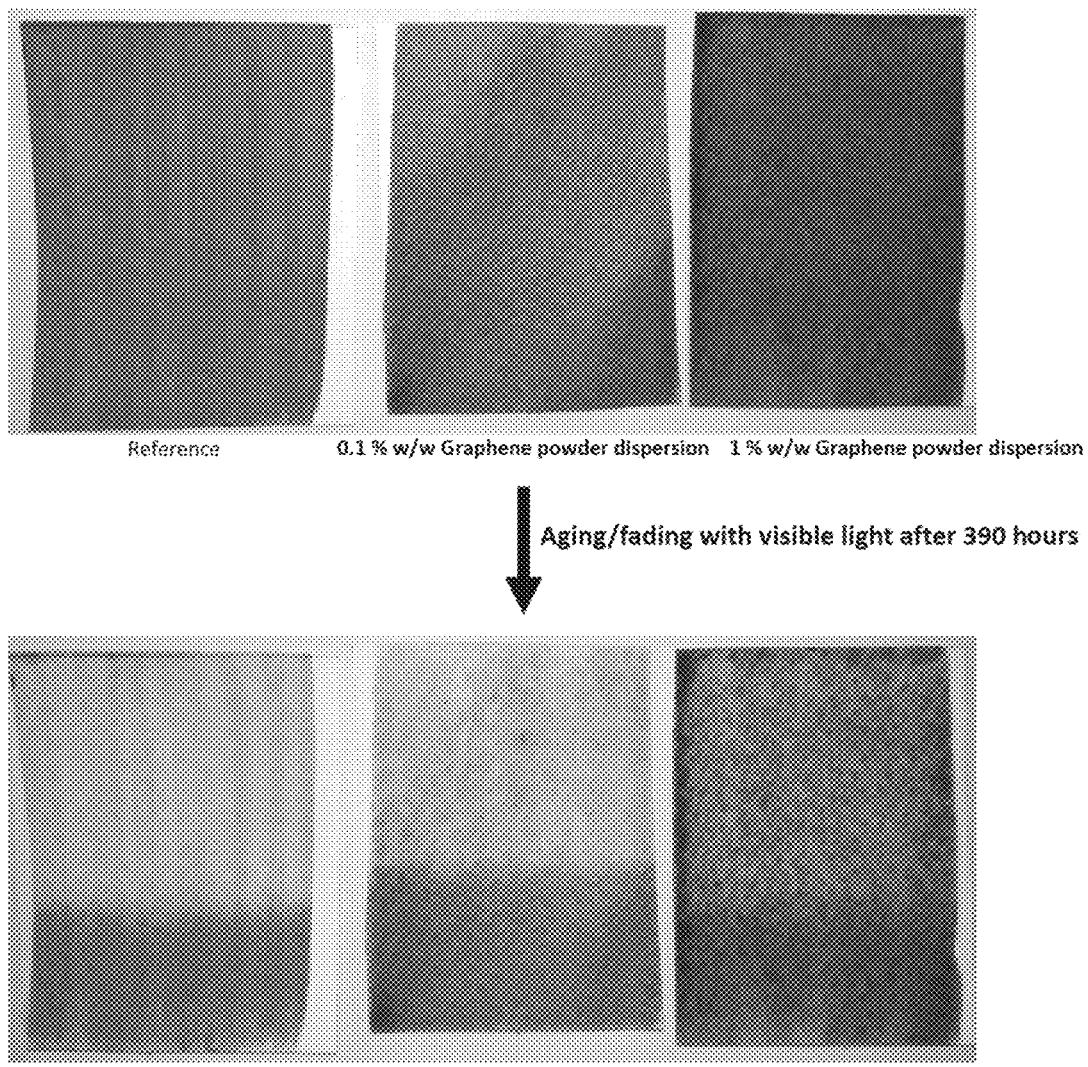
FIG. 10B: Paper mockups dyed with pink ink (Carmine) of Pelikan brand featuring graphene. Up: From left to right, a reference sample (without graphene) and samples with 0.1% w/w and 1% w/w graphene powder dispersion. Down: The same dyed papers after an aging of 390 hours with white/visible light. Please note that the lower part of the samples was covered by a thick cardboard paper in order to have an unaged area, as reference. It is obvious that all samples are faded, but as graphene concentration increases, the fading is less.

FIG. 10 shows some samples obtained using such ink before and after exposure to visible light.

Tables 5 and 6 shows the Delta E values and the protection factor after treatment of samples comprising inks obtained as described above.

TABLE 5

Aging with strong UV light, from a UV-C lamp (254 nm) with a power of 4 mWatts

| Sample | Delta E after aging/fading | Protection Factor |
|---|---|---|
| Reference sample with blue color | 56.10 | — |
| Blue colored with 0.1% w.w. Graphene powder dispersion | 44.82 | 20.10 |
| Blue colored with 1% w.w. Graphene powder dispersion | 33.66 | 40.00 |
| Blue colored with 0.1% w.w. Graphene oxide solution | 35.16 | 37.30 |
| Blue colored with 1% w.w. Graphene oxide solution | 27.20 | 51.50 |
| Reference sample with pink color | 36.10 | — |
| Pink colored with 0.1% w.w. Graphene powder dispersion | 24.38 | 32.46 |
| Pink colored with 1% w.w. Graphene powder dispersion | 20.74 | 42.54 |
| Pink colored with 0.1% w.w. Graphene oxide solution | 25.62 | 29.04 |
| Pink colored with 1% w.w. Graphene oxide solution | 21.73 | 39.80 |

TABLE 6

Aging with visible light, from an in-house built aging chamber, equipped with seven lights panel, with a power of 33 mWatt.

| Sample | Delta E after aging/fading | Protection Factor |
|---|---|---|
| Reference sample with blue color | 51.16 | — |
| Blue colored with 0.1% w.w. Graphene powder dispersion | 45.57 | 10.90 |
| Blue colored with 1% w.w. Graphene powder dispersion | 34.15 | 33.24 |

TABLE 6-continued

Aging with visible light, from an in-house built aging chamber, equipped with seven lights panel, with a power of 33 mWatt.

| Sample | Delta E after aging/fading | Protection Factor |
|---|---|---|
| Blue colored with 0.1% w.w. Graphene oxide solution | 41.30 | 19.31 |
| Blue colored with 1% w.w. Graphene oxide solution | 29.62 | 42.10 |
| Reference sample with pink color | 36.62 | — |
| Pink colored with 0.1% w.w. Graphene powder dispersion | 33.25 | 9.20 |
| Pink colored with 1% w.w. Graphene powder dispersion | 25.05 | 31.60 |
| Pink colored with 0.1% w.w. Graphene oxide solution | 27.12 | 25.94 |
| Pink colored with 1% w.w. Graphene oxide solution | 23.66 | 35.40 |

Example 7

Figure 11A:
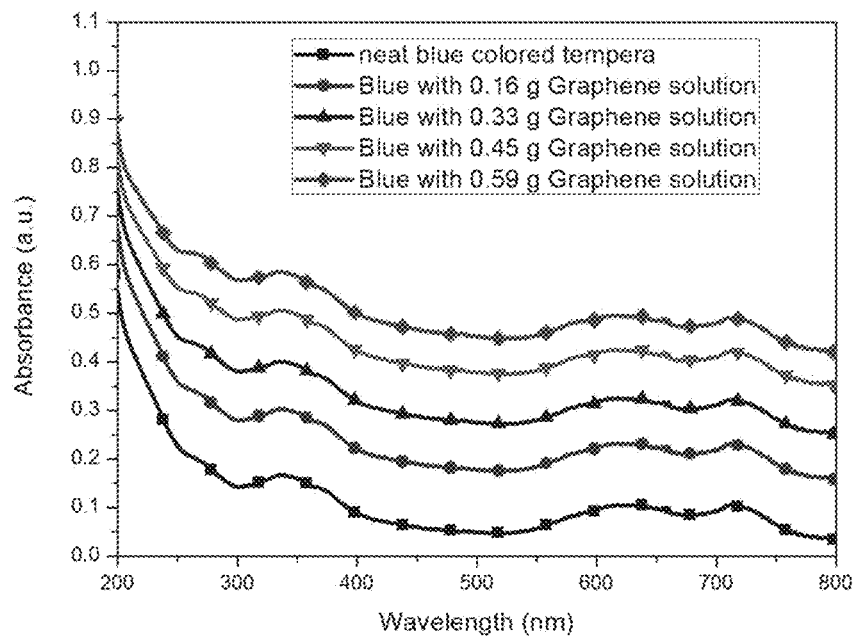
FIG. 11A: The absorbance of blue tempera solutions including increasing amounts of graphene
Figure 11B:
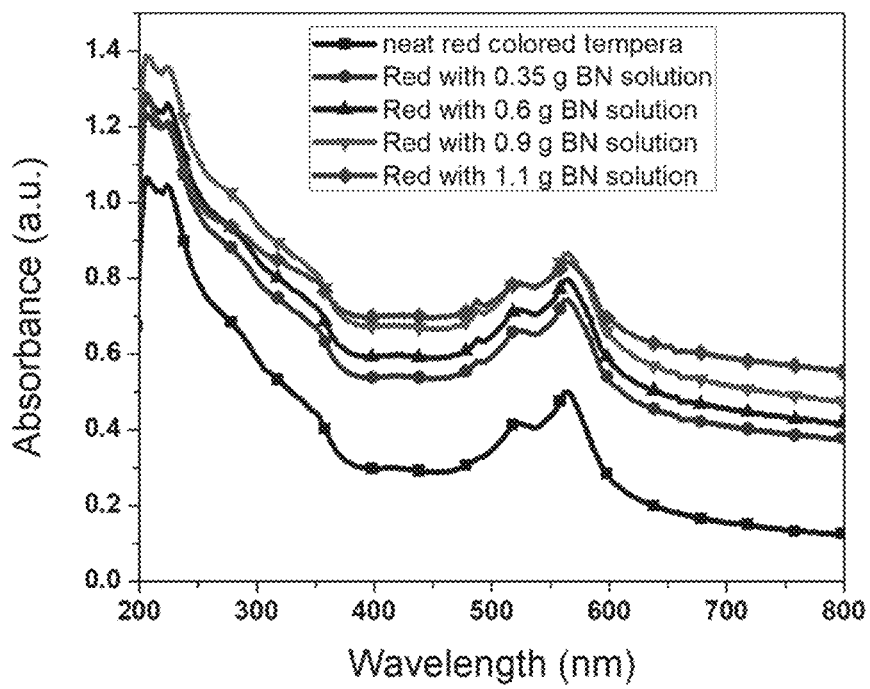
FIG. 11B: The absorbance of red tempera solutions including increasing amounts of boron nitride powder.

Creation of Graphene-Based Acrylic Paints and Preparation of Samples for UV Exposure For the creation of graphene-based acrylic paints, some commercial acrylic paints (temperas) of a well-known brand, Talens Art Creation, were purchased which are used by many professionals and amateur artists. Particularly, art creation No 369, Primary Magenta (red) and art creation No 572, Primary Cyan (blue) were examined. These commercial acrylics were water soluble. For this application, again, GNPs—Electrical grade were used, but this time they were dispersed in distilled water. An amount of 35 mg of GNPs was dissolved in 15 g of distilled water. Then, from this solution, 0.16, 0.33, 0.45 and 0.59 g were added in vials that each one contained 10 ml of distilled water, in order to obtain 5 solutions with increased concentration in graphene. An ultrasonic bath sonication for 30 minutes followed. For the creation of aqua sols with acrylic paint and graphene, 0.5 g of the examined color were dissolved in 400 ml of distilled water. Taking a standard amount of this solution each time, and using the 5 pre-mentioned graphene dispersions, 5 solutions with diluted color and increasing graphene concentration were examined. An ultrasonic bath sonication for 30 minutes was performed, and then the sols were measured in the UV/Vis spectrophotometer for absorbance (FIG. 11A). Exactly the same logic was used for boron nitride which was supplied by Thomas Swan (FIG. 11B).

Figure 11C:
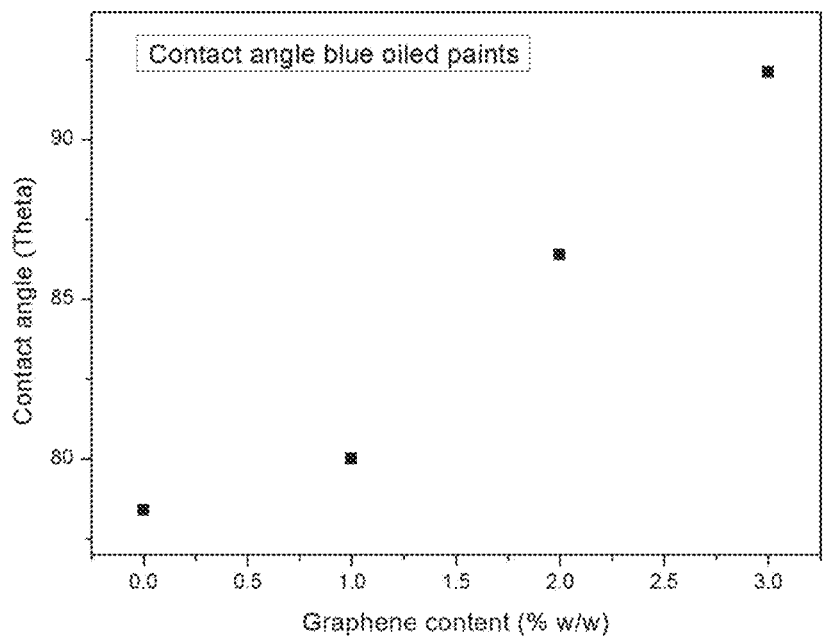
FIG. 11C: Contact angle measurements for a blue oil paint containing increasing amounts of graphene.
Figure 11D:
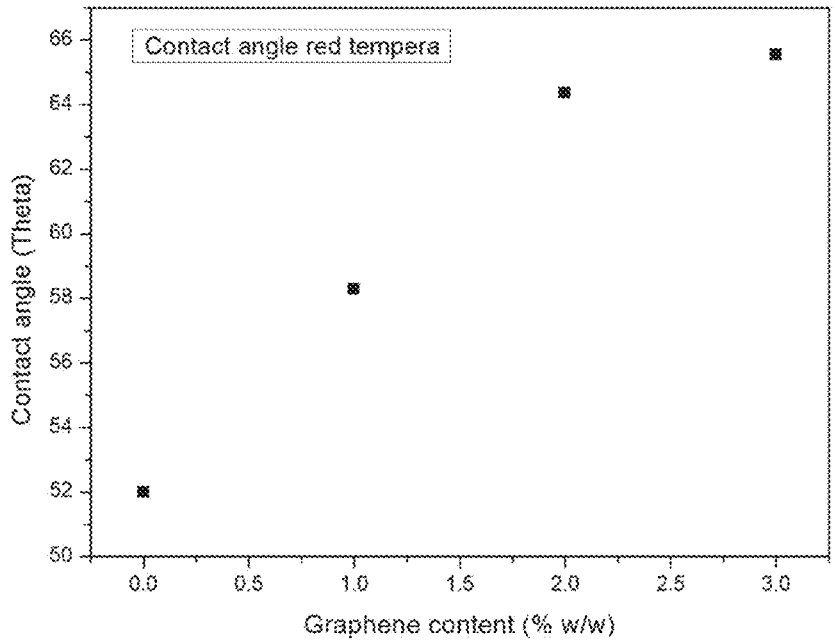
FIG. 11D: Contact angle measurements for a red oil paint containing increasing amounts of graphene.

For the creation of graphene-based oiled paints, blue oil paint of a well-known brand, "van Gogh" by Talens, which is used by many professionals and amateur artists, was purchased. This commercial oil paint is soluble to turpentine oil. For this application, GNPs—Electrical grade were used. A certain amount of GNPs was added in a standard amount of the paint in order to make 3 new paints with different concentrations, 1, 2 and 3% w/w graphene powder. An ultrasonic bath sonication for 30 minutes followed, and then the contact angle measurements with distilled water (FIG. 11C). The same measurement was performed for a red tempera (as described above) including increasing amounts of 1, 2 and 3% w/w of graphene powder (FIG. 11D).

The invention claimed is:

1. A method for protecting a two- or three-dimensional artwork against color degradation, the method comprising the steps of:
   a) depositing graphene onto at least one side of a supporting substrate to produce a graphene/substrate composite comprising a continuous graphene membrane formed on at least one side of said supporting substrate;
   b) removing said supporting substrate, or lifting off the graphene membrane from said supporting substrate;
   c) depositing the graphene membrane onto the two- or three-dimensional artwork; and
   d) removing the graphene membrane without irreversible interference with the artwork.

2. A method according to claim 1, wherein the supporting substrate is selected from the group consisting of a metal, polymer and non-metal material.

3. A method according to claim 2, wherein the supporting substrate is selected from the group consisting of a flexible sheet and a foil material.

4. A method according to claim 1, further comprising the step of:
   after step a), applying a supporting layer onto the graphene membrane bearing side of the graphene/substrate composite to produce a supporting layer/graphene/substrate composite.

5. A method according to claim 4, wherein the supporting layer is selected from the group consisting of a polymer-based backing substrate and adhesive film.

6. A method according to claim 5, wherein the polymer-based backing substrate or the adhesive film is at least one member selected from the group consisting of a flexible material and transparent.

7. A method according to claim 5, wherein the polymer-based backing substrate or the adhesive film is at least one member selected from the group consisting of a PET-, PMMA-, and PET/silicone film or membranes.

8. A method according to claim 4, wherein the supporting layer is a pressure-sensitive adhesive film.

9. A method according to claim 1, wherein the color degradation is fading, yellowing or discoloration due to exposure to UV radiation.

10. A method according to claim 1, wherein additionally an oxygen plasma treatment is performed after step a).

11. A method according to claim 1, wherein, in step c, depositing of the graphene membrane onto the surface is performed via a roll-to-roll coating or unrolling process.

12. A method according to claim 11, wherein the roll-to-roll coating or unrolling process are performed under at least one of the following conditions:
   a temperature of 45 to 70° C., a pressure of 0.1 to 10 MPa, and a rolling speed of 0.1 to 5 mm/sec.

13. A method according to claim 1, wherein the protective graphene coating is a continuous graphene membrane having dimensions from a few centimeters up to several meters is deposited to fully or at least partially cover the surface or artwork.

14. A method according to claim 1, wherein in step a) a continuous graphene monolayer or multilayer membrane is formed.

15. A method according to claim 14, wherein the membrane has a thickness of from 0.33 nm to n×0.33 nm, wherein n is a number of layers in the multilayer membrane.

16. A method according to claim 1, wherein the surface to be coated exhibits a surface roughness from 1 nm to 10 μm and/or a surface energy of 17 to 64 mN/m.

17. A method according to claim 1, wherein the surface to be coated comprises a member selected from the group consisting of canvas, paper, cardboard, photographic paper, wood, a polymer, a painting, papyrus, a cover of old music vinyl records, a cover page of a magazine, an interior page of a magazine, a book cover, a page of a book, a mural, artistic masonry and an art installation.

18. A method according to claim 1, further comprising protection for the artwork against dirt, dust, moisture, chemical and/or oxidizing agents.

19. A method according to claim 1, wherein applying the supporting layer is performed via a roll-to-roll coating process.

20. A method according to claim 1, wherein applying the supporting layer is performed via direct compression transfer.

21. A method according to claim 1, wherein in step a) a graphene monolayer or multilayer membrane is formed, the graphene monolayer or membrane having a thickness of from 0.33 nm to n×0.33 wherein n is a number of layers in the multilayer membrane.

* * * * *